(12) United States Patent
Okamoto et al.

(10) Patent No.: US 7,622,184 B2
(45) Date of Patent: Nov. 24, 2009

(54) MULTILEVEL INTERCONNECTION BOARD AND METHOD OF FABRICATING THE SAME

(75) Inventors: Keishiro Okamoto, Kawasaki (JP); Mamoru Kurashina, Kawasaki (JP); Tomoyuki Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 305 days.

(21) Appl. No.: 11/339,511

(22) Filed: Jan. 26, 2006

(65) Prior Publication Data

US 2007/0077391 A1    Apr. 5, 2007

(30) Foreign Application Priority Data

Oct. 3, 2005    (JP)    ............................. 2005-290357

(51) Int. Cl.
   B32B 5/26        (2006.01)
   B32B 7/02        (2006.01)
   B32B 7/04        (2006.01)
   H05K 1/03        (2006.01)
   H01L 23/485      (2006.01)

(52) U.S. Cl. .................... 428/299.1; 174/255; 174/257; 174/258; 257/746; 361/771; 428/212; 428/297.4; 442/366; 442/389; 442/414; 442/415

(58) Field of Classification Search ........................ None
   See application file for complete search history.

(56) References Cited

U.S. PATENT DOCUMENTS

| | | | | |
|---|---|---|---|---|
| 7,224,046 B2 * | 5/2007 | Abe et al. | ................... | 257/668 |
| 2002/0090873 A1 * | 7/2002 | Moody | ..................... | 442/268 |
| 2003/0136577 A1 * | 7/2003 | Abe | ......................... | 174/255 |

FOREIGN PATENT DOCUMENTS

| | | |
|---|---|---|
| JP | 3-104191 | 5/1991 |
| JP | 5-286776 | 11/1993 |
| JP | 2003-273482 | 9/2003 |
| WO | WO 2004064467 A1 * | 7/2004 |

* cited by examiner

Primary Examiner—Jennifer A Chriss
(74) Attorney, Agent, or Firm—Westerman, Hattori, Daniels & Adrian, LLP

(57) ABSTRACT

A stack of 50 layers of a first pitch-base carbon fiber sheet is formed, two sets of stack each having two second pitch-base carbon fiber sheets stacked therein are fabricated. At this time, the second carbon fiber sheets have a thermal expansion coefficient larger than that of the first carbon fiber sheet. Next, the stack of the first carbon fiber sheet is then held between two sets of stack of the second carbon fiber sheets. The stack of the first and second carbon fiber sheets are then impregnated with an epoxy-base resin composition and the resin is solidified. As a result a prepreg composed of the first and second carbon fiber sheets and the resin component composed of the epoxy-base resin composition is obtained. Thereafter, interconnections and the like are then formed on the prepreg, to thereby complete a multilevel interconnection board.

7 Claims, 7 Drawing Sheets

MULTILEVEL INTERCONNECTION BOARD AND METHOD OF FABRICATING THE SAME

CROSS-REFERENCE TO RELATED APPLICATIONS

This application is based upon and claims the benefit of priority from the prior Japanese Patent Application No. 2005-290357, filed on Oct. 3, 2005, the entire contents of which are incorporated herein by reference.

BACKGROUND OF THE INVENTION

1. Field of the Invention

The present invention relates to a multilevel interconnection board used for testing semiconductor devices and so forth, and a method of fabricating the same.

2. Description of the Related Art

Tester board (multilevel interconnection board) is used typically in electrical tests of wafers having semiconductor devices formed thereon, in order to make contact between probes and terminals of each semiconductor device. A high level of dimensional accuracy is required for the multilevel interconnection board, because the probes and terminals are disposed at extremely narrow intervals. With recent increase in size of wafers, an extremely high dimensional accuracy has been required for the multilevel interconnection board applied in particular to 300-mm-diameter wafers. In some cases, the multilevel interconnection board is used also under high temperatures. The core base and/or top layer of the multilevel interconnection board are therefore configured using a material having a small thermal expansion coefficient, which is less likely to deform even under high temperatures. Examples of multilevel interconnection board ever put into practical use include those having core base composed of Invar (Fe—Ni-base alloy), Covar (Fe—Ni—Co-base alloy) and carbon-fiber-reinforced plastics (CFRP).

A known structure adopted to the multilevel interconnection board is such as having the thermal expansion coefficient α which decreases in the direction from the core base to the surficial portion. An exemplary structure ever adopted is such as having a carbon-fiber-impregnated resin component ($\alpha=1$) held between glass-fiber-impregnated resin components ($\alpha=15$), and the stack is further held between thin-film multilevel resin components ($\alpha=20$). Adoption of this structure makes it possible to reduce difference between thermal expansion coefficients at the interface between the different materials.

The multilevel interconnection board may, however, be suffered from warping or cracking even if the above-described structure is adopted, due to internal stress concentrated at the interface at a temperature as high as around 150° C. The board may also cause short-circuiting due to impregnation of copper plating solution in the process of forming interconnections in through-holes. This consequently makes the board unavailable for reliability test under high-temperature, high-humidity conditions.

Related arts are disclosed in a patent document 1 (Japanese Patent Application Laid-Open No. 2003-273482), a patent document 2 (Japanese Patent Application Laid-Open No. 3-104191), and a patent document 3 (Japanese Patent Application Laid-Open No. 5-286776).

SUMMARY OF THE INVENTION

It is therefore an object of the present invention to provide a multilevel interconnection board capable of suppressing dimensional changes under high temperatures, and a method of fabricating the same.

The multilevel interconnection board according to the present invention has a base, and a plurality of interconnection layers formed on the base. The base is provided with a first fiber group, and a second fiber group. The second fiber group is disposed closer to the interconnection layers than the first fiber group. The second fiber group has a thermal expansion coefficient larger than that of the first fiber group.

According to the method of fabricating the multilevel interconnection board of the present invention, a base is formed by stacking a first fiber group and a second fiber group having a thermal expansion coefficient larger than that of the first fiber group, and a plurality of interconnection layers are then formed on the second fiber group of the base.

DETAILED DESCRIPTION OF THE PREFERRED EMBODIMENTS

Paragraphs below will specifically explain embodiments of the present invention, referring to the attached drawings. It is to be noted that a structure of the multilevel interconnection board will be described in conjunction with a method of fabrication of the same for the convenience's sake. FIGS. 1A to 1L are sectional views sequentially showing process steps of the method of fabrication of the multilevel interconnection board according to the embodiment of the present invention.

Figure 1A:
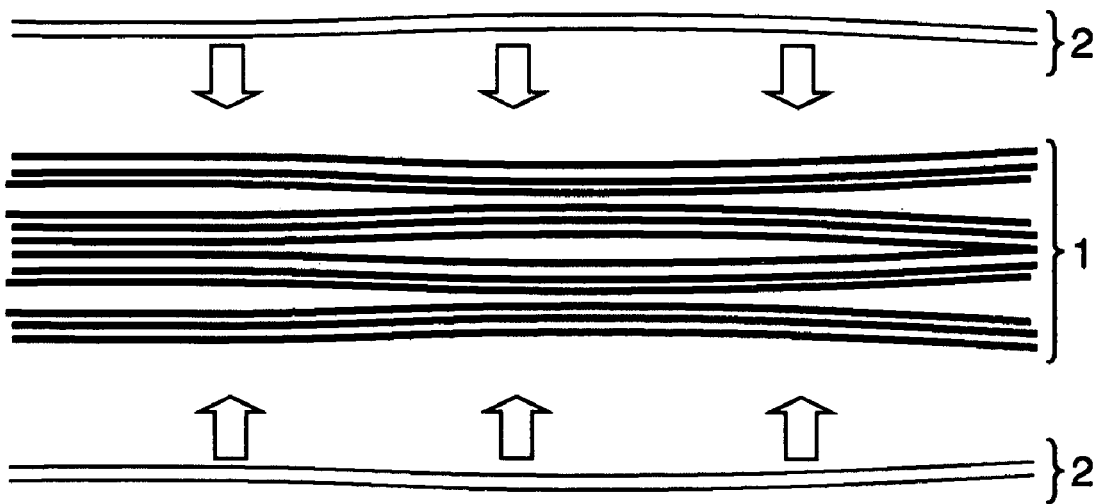
FIG. 1A to FIG. 1L are sectional views sequentially showing a method of fabricating a multilevel interconnection board according to an embodiment of the present invention.

In this embodiment, a stack (first carbon fiber group) having stacked therein 50 pitch-base, plain-woven carbon fiber sheets 1, each having an areal weight of carbon fiber of 300 g/m² and a tensile elastic constant of 600 GPa, is formed. Two sets of stack (second carbon fiber group), each having stacked therein two pitch-base unidirectionally-woven carbon fiber sheets 2, for example, having an areal weight of carbon fiber of 100 g/m² and a tensile elastic constant of 400 GPa, are formed. The areal weight of carbon fiber of the carbon fiber sheets 2 herein is set smaller than that of the carbon fiber sheet 1, because there is a demand of setting the thermal expansion coefficient of the carbon fiber sheet 2 larger than that of the carbon fiber sheet 1 in the present embodiment. Next, as shown in FIG. 1A, the stack of the carbon fiber sheets 1 is held between two sets of stacks of the carbon fiber sheet 2.

Figure 1B:
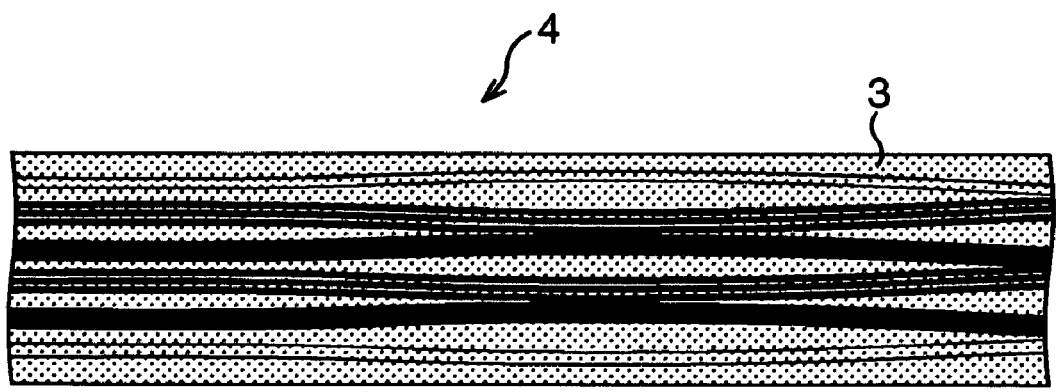

Next, as shown in FIG. 1B, an epoxy-base resin composition, for example, is impregnated into the stack of the carbon fiber sheets 1 and 2, and the resin is then allowed to solidify. A prepreg 4 containing the carbon fiber sheets 1 and 2 and the resin component 3 composed of the epoxy-base resin composition is thus formed. The prepreg 4 is, for example, 1.0 mm in thickness, and has a planar geometry of a 340 mm×510 mm rectangle. The epoxy-base resin composition is preliminarily mixed, for example, with an alumina filler and a silica filler. The each amount of the alumina filler and the silica filler is 10% by weight of the whole composition. The alumina filler used herein has a mean particle size of 7 μm or less, and a thermal expansion coefficient of 7 ppm/K. The silica filler used herein has a mean particle size of 3 μm or less, and a thermal expansion coefficient of 3 ppm/K.

Thus formed prepreg 4 has, for example, a mean thermal expansion coefficient in the thickness-direction (the Z direction) of 80 ppm/K or around, and a mean thermal expansion coefficient in the direction in parallel with the surface (the X direction and the Y direction) of 2 ppm/K or around. The mean thermal expansion coefficients herein are mean values of the thermal expansion coefficients within the temperature range from 25° C. to 200° C. The fillers are mixed herein for the purpose of approximating the thermal expansion coefficient of the resin component 3 to the thermal expansion coefficient of a metal material composing the interconnections, such as Cu. For an exemplary case where Cu interconnections are used, the thermal expansion coefficient thereof is 17 ppm/K, whereas the thermal expansion coefficient of the resin component 3 solely composed of the epoxy-base resin composition falls in the range from 30 ppm/K to 60 ppm/K. That is why the alumina filler and/or the silica filler, having the thermal expansion coefficients smaller than that of Cu, are allowed to diffuse into the epoxy-base resin composition so as to adjust the thermal expansion coefficient.

Figure 1C:
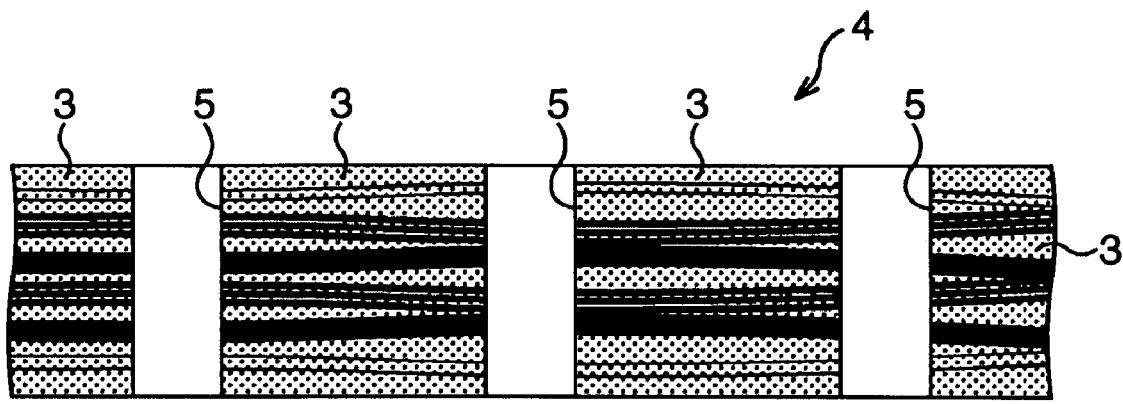

Thereafter, as shown in FIG. 1C, approximately 1,000 through-holes 5 of 0.5 mm in diameter are formed in the prepreg 4 using a drill. There are no special limitations on the number of formation, position, and geometry of the through-holes, allowing determination of these parameters considering design information on the interconnection layout.

Figure 1D:
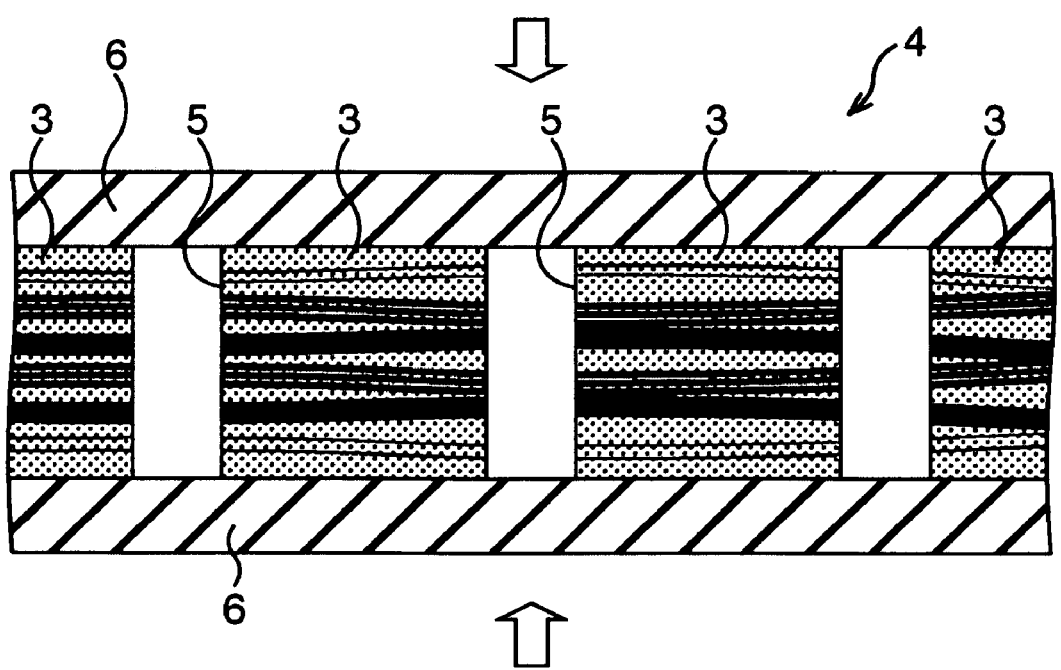

Next, as shown in FIG. 1D, insulating resin sheets 6 are stuck on both surfaces of the prepreg 4. The insulating resin sheets 6 used herein are, for example, composed of a thermoplastic polyimide sheet. The insulating resin sheets 6 are stuck, for example, using a vacuum laminator at a temperature of 120° C., and under a pressure of 0.1 MPa.

Figure 1E:
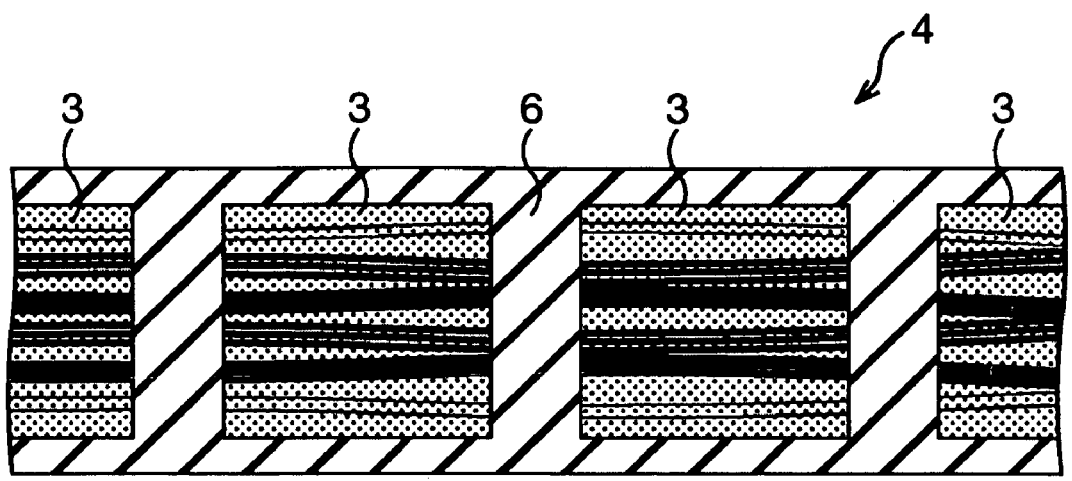

Next, the stack is subjected to vacuum pressing at 200° C. for 30 minutes so as to fill the insulating resin component into the through-holes 5, as shown in FIG. 1E. The thickness of the portion of the prepreg 4 remaining on both sides is set to 0.05 mm. It is also allowable to fill the insulating resin component by using a known laminator, vacuum laminator or laminate pressing apparatus.

Figure 1F:
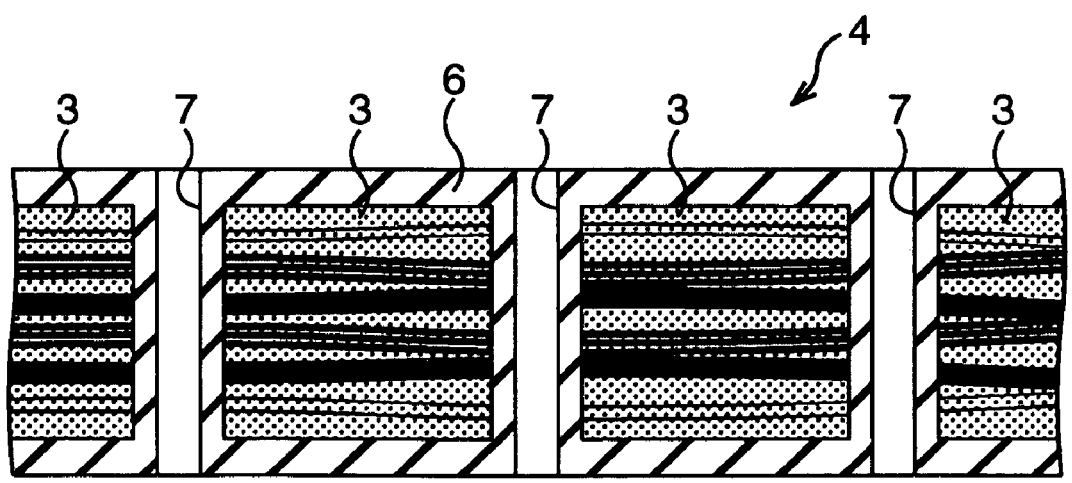

Next, as shown in FIG. 1F, a through-hole 7 of 0.2 mm in diameter is formed at the center of the insulating resin component filled in each of the through-holes 5 using a UV-YAG laser. It is also allowable to form the through-holes 7 by using a carbon dioxide gas laser or an excimer laser. It is also allowable to form them by plasma-assisted dry etching process. It is still also allowable to mechanically form them using a drill.

Figure 1G:
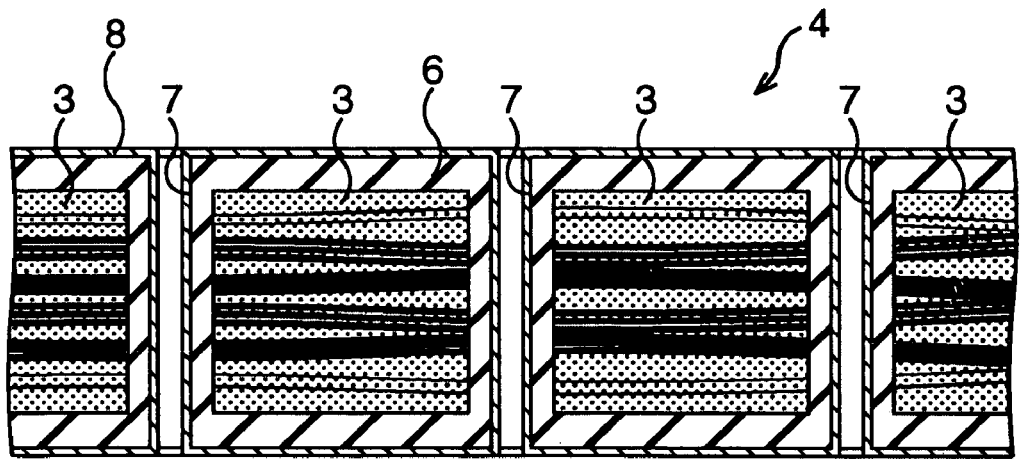

The prepreg 4 is then subjected to desmearing using permanganic acid for the purpose of removing resin residue and the like, and of modifying the surface thereof. A catalyst is then applied over the entire surface, and an electroless plated copper film is then formed as a seed layer 8 over the entire surface, as shown in FIG. 1G. Further thereon, a dry-type resist film is stuck. The dry-type resist film herein is stuck, for example, using a vacuum laminator at a temperature of 110° C. and under a pressure of 0.1 MPa. The seed layer 8 is formed also in the through-holes 7. After completion of the sticking, the dry-type resist film is then patterned to obtain a shape of interconnections. In the patterning, a portion of the dry-type resist film where the interconnection will be formed later is removed, for example, by a photolithographic process. The seed layer 8 is then patterned by etching through the patterned dry-type resist film as a mask, to thereby obtain the shape of the interconnection pattern. An etching solution applicable herein is, for example, a mixed solution of hydrogen peroxide and sulfuric acid. The dry-type resist film is then removed. The dry-type resist film can be removed simply by immersing the dry-type resist film and the like into a sodium-hydroxide-base solution at 60° C. or around for 5 minutes. It is also allowable to ash the resist film by oxygen ashing.

Figure 1H:
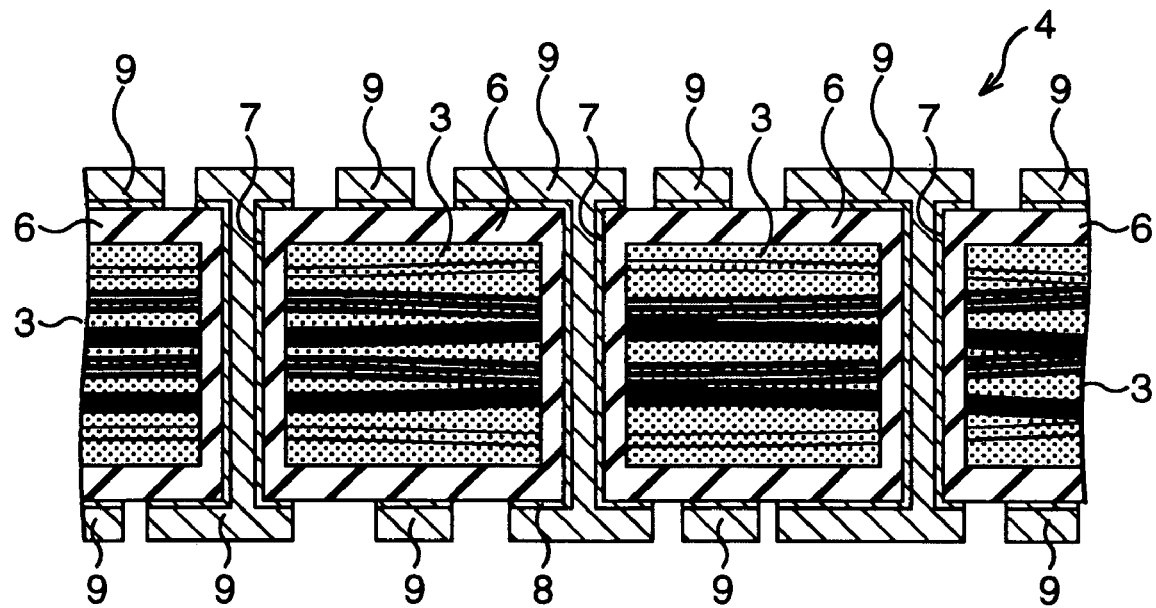

Next, an electroplated copper film is formed on the seed layer 8 so as to form interconnections 9, as shown in FIG. 1H. It is to be noted that the interconnections 9 are formed also in the through-holes 7, because the seed layer 8 already resides also in the through-holes 7 prior to the formation of the electroless plated copper film.

Figure 1I:
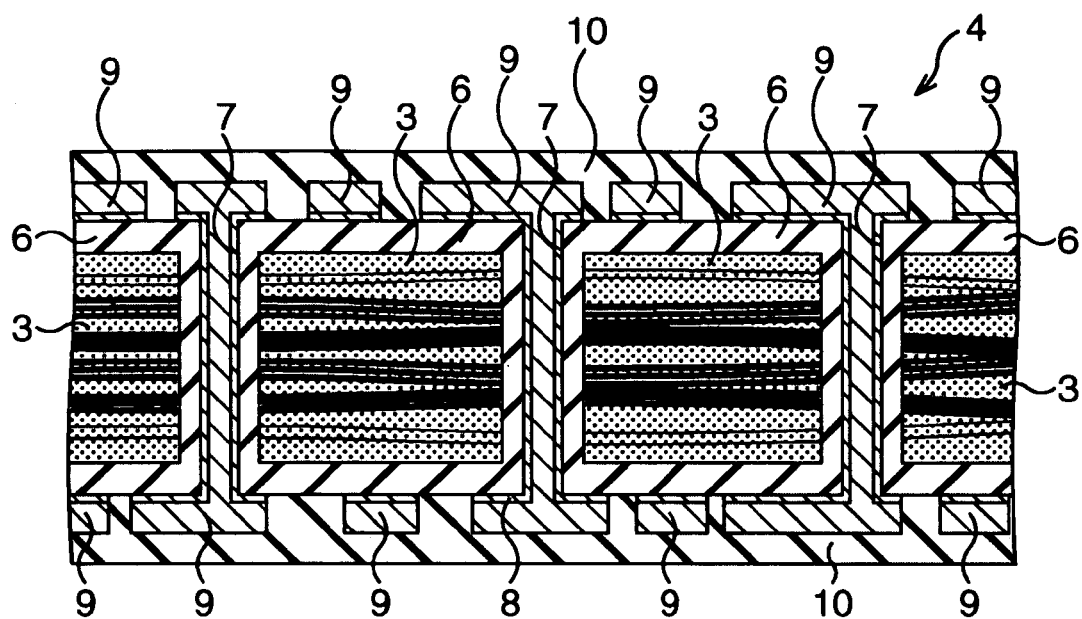
Figure 1J:
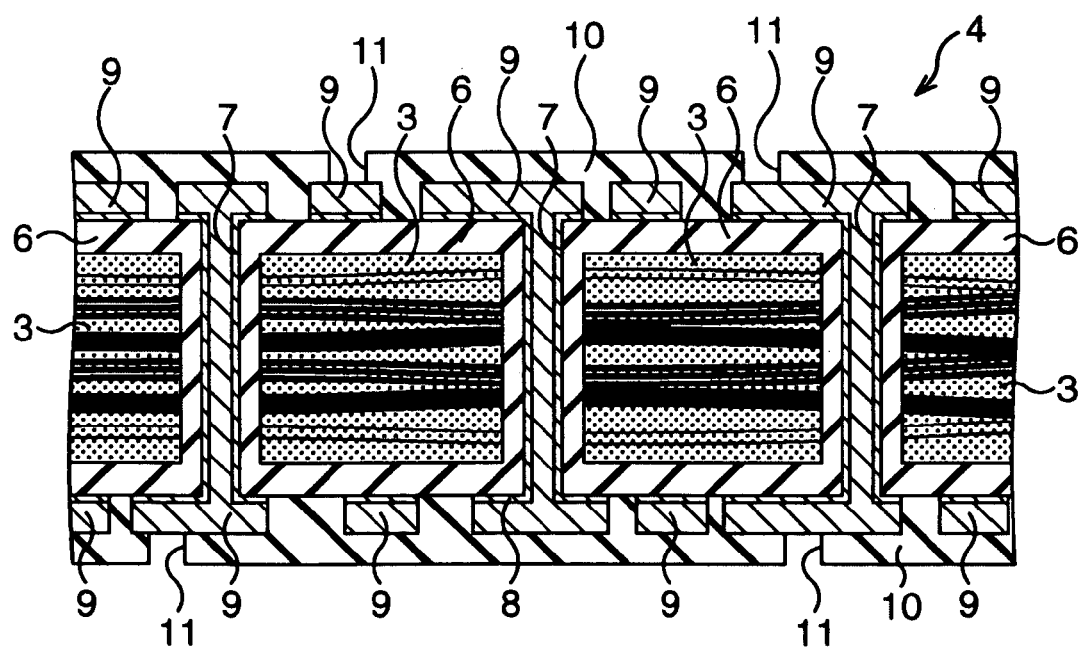

Next, as shown in FIG. 1I, an insulating resin sheets 10 composed of photo-sensitive polyimide, for example, are stuck on the interconnections 9 under pressing. Next, as shown in FIG. 1J, holes 11 are formed in the insulating resin sheets 10 by a photolithographic process, so as to reach the interconnections 9.

Figure 1K:
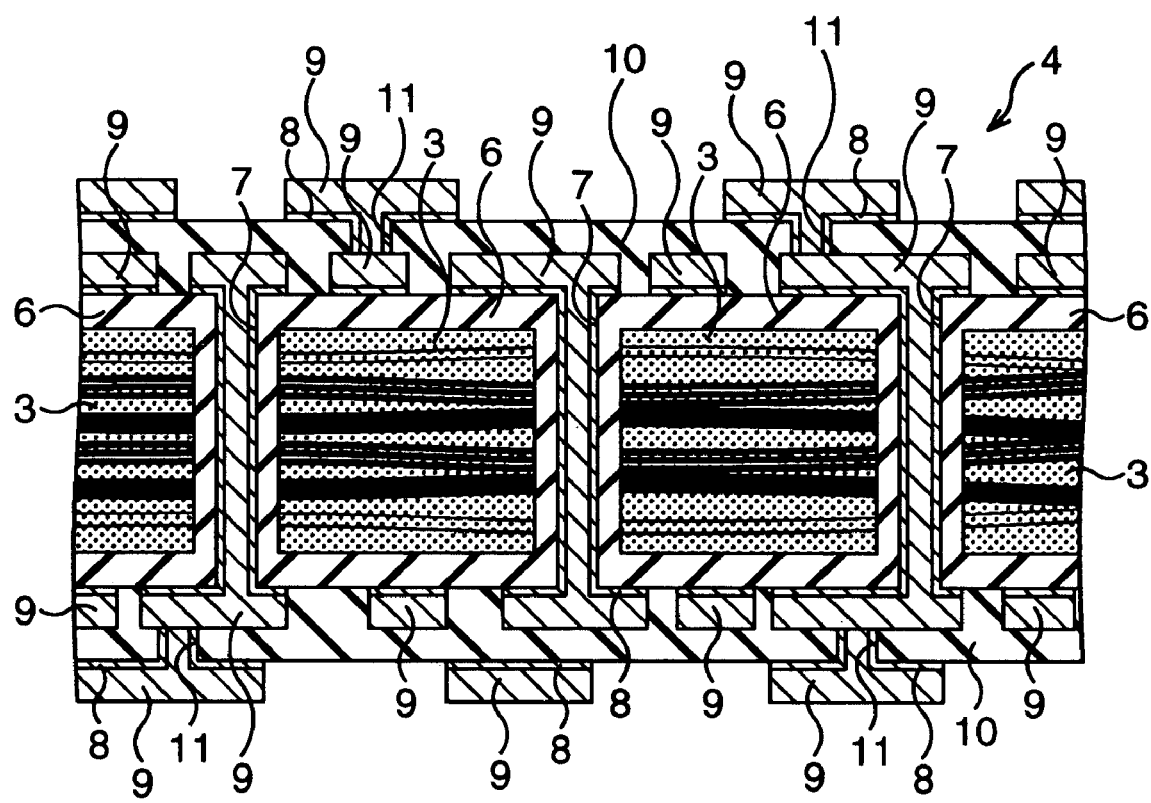
Figure 1L:
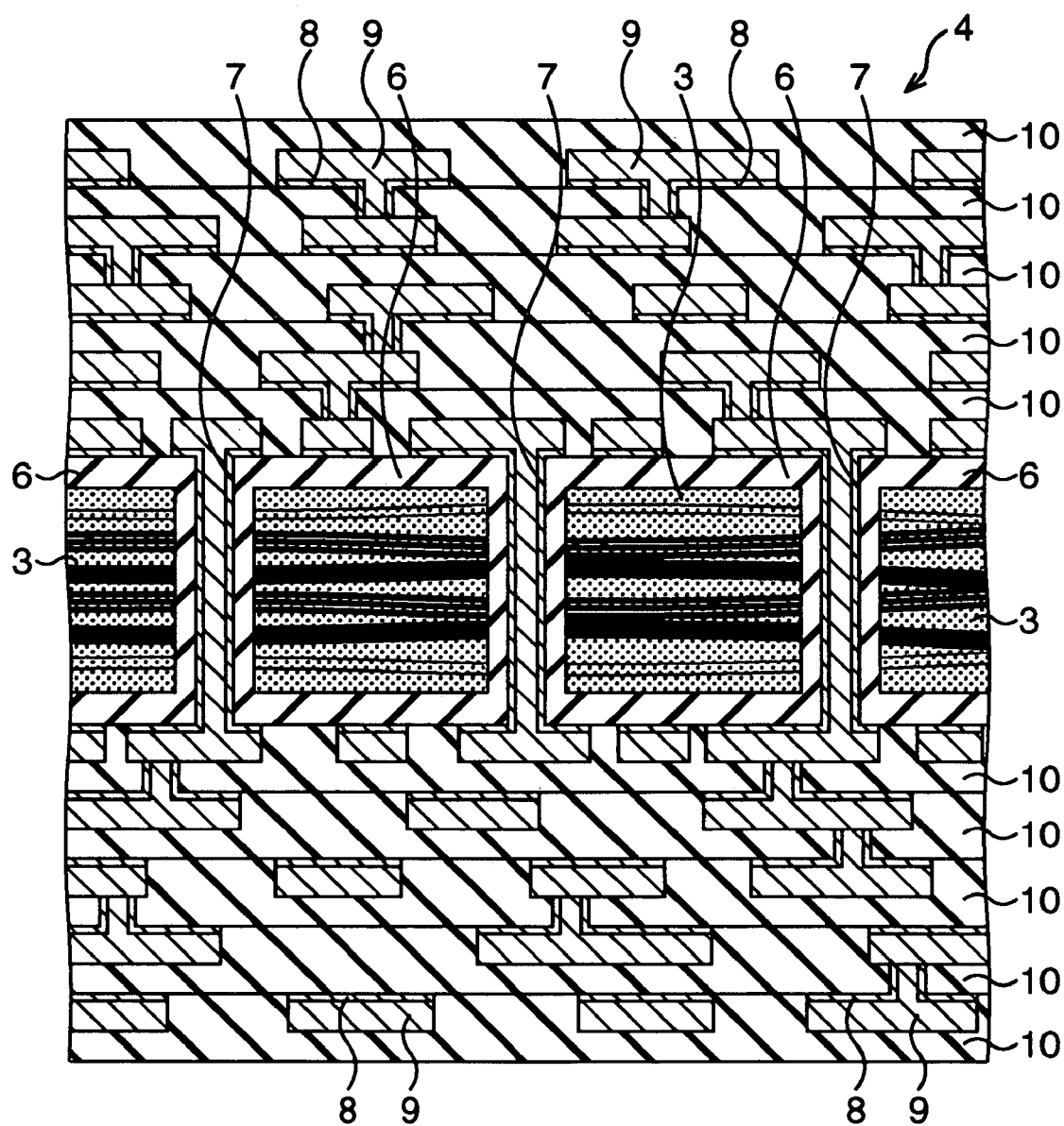

Thereafter, a catalyst is applied over the entire surface, and as shown in FIG. 1K, another cycle of formation and processing of the seed layer 8 composed of an electroless plated copper film, and formation of the interconnections 9 composed of an electroplated copper film are carried out. Process steps from the formation of the insulating resin sheets 10 up to the formation of the interconnections 9 are repeated thereafter, to thereby form five interconnection layers in total respectively on both of the two surfaces, as shown in FIG. 1L. An overcoat layer is succeedingly formed by a combined process of a screen printing process and a photolithographic process, to thereby complete the multilevel interconnection board.

In thus fabricated multilevel interconnection board, the thermal expansion coefficient of the carbon fiber sheet 2 composing the prepreg 4 as the base is larger than the thermal expansion coefficient of the carbon fiber sheet 1. As a consequence, the thermal expansion coefficient of the prepreg 4 gradually increases in the thickness-direction from the center portion towards the surface. The thermal expansion coefficient of the surficial layers composed of the seed layers 8, the interconnections 9 and the insulating resin sheets 10 is larger than that of the prepreg 4. This embodiment therefore makes it possible to further moderate difference between the thermal expansion coefficients between the prepreg 4 and the surficial layers. More specifically, the conventional structure, in which the thermal expansion coefficients differ by 15 ppm/K or more between the core base and the layer formed thereon, may raise internal stress ascribable to the difference in the thermal expansion coefficient, whereas this embodiment can suppress such unfavorable phenomenon. This makes it possible to further suppress the dimensional variation even if the board is used under a high-temperature, high-humidity conditions, so that the board is preferably adopted to reliability tests of wafers.

The present inventors practically tested the multilevel interconnection board, fabricated as described in the above embodiment, and obtained results as below. In this test, a heat cycle of keeping the board at −65° C. for 30 minutes and then at +125° C. for 30 minutes was repeated 1,000 times. Ratio of change of the contact resistance was found to be +5% or less. No peeling-off and crack were observed in the vicinity of the through-holes 7 and the like. There was also no observation of short-circuiting ascribable to impregnation of the copper plating solution used for forming the interconnections 9 in the through-holes 7.

On the other hand, the same test made on a multilevel interconnection board fabricated by the conventional method showed short-circuiting at the center portion of the through-holes.

As the carbon fiber, it is also allowable to use PAN (polyacrylonitrile)-base carbon fiber, short carbon fiber, and non-woven-fabric-base carbon fiber. For the case where the PAN-base carbon fiber is used, it is allowable to use, for example, a plain-woven carbon fiber sheet having an areal weight of carbon fiber of 450 g/m$^2$ and a tensile elastic constant of 500

GPa as the carbon fiber sheet 1, and to use a unidirectionally-woven carbon fiber sheet having an areal weight of carbon fiber of 100 g/m² and a tensile elastic constant of 300 GPa as the carbon fiber sheet 2. The same test practically made by the present inventors on a multilevel interconnection board fabricated using these materials showed results similar to those obtained in the above-described embodiment.

As a fiber group composing the prepreg (base), it is also allowable to use a glass fiber group, beside the carbon fiber group.

The thermal expansion coefficient is adjustable also by a method other than the adjustment of the areal weight of carbon fiber. For example, it is also allowable to set the thermal expansion coefficient of the carbon fiber composing the stack of the carbon fiber sheets on the surficial layer side (second carbon fiber group) larger than the thermal expansion coefficient of the carbon fiber composing the stack of the carbon fiber sheets in the center portion (first carbon fiber group). It is still also allowable to set the fiber density per unit volume of the second carbon fiber group smaller than the fiber density of the first carbon fiber group. This is because the larger the fiber density of the carbon fiber group becomes, the larger the carbon fiber content per unit area becomes, and this consequently increases the tensile elastic constant of the carbon fiber group, and reduces the thermal expansion coefficient. The same will apply also to the case where a glass fiber group is used. It is still also allowable to set the carbon purity of the second carbon fiber group smaller than the carbon purity of the first carbon fiber group. This is because the higher the carbon purity becomes, the more readily can intrinsic characteristics of carbon be obtained, and this consequently raises the elastic constant, and reduces the thermal expansion coefficient.

The insulating resin sheet 10 composing the surficial layer may be provided with variation in the characteristics such as thermal expansion coefficient and elastic constant. For example, it is preferable to set the thermal expansion coefficient of the insulating resin sheet 10 in contact with the prepreg 4 smaller than the thermal expansion coefficient of the insulating resin sheet 10 disposed thereon or above. In other words, it is preferable to minimize the thermal expansion coefficient of the insulating resin sheet 10 at the portion in contact with the prepreg 4. This is because the provision of such variation makes it possible to further moderate the changes in the thermal expansion coefficient over the entire range of the multilevel interconnection board. Also the thermal expansion coefficient of the insulating resin sheet 10 is adjustable by varying, for example, the density of the fiber to be contained therein. Also with respect to the characteristics such as elastic constant, adjustment of the characteristics of the insulating resin sheet 10 in contact with the prepreg 4 to an intermediate level of those of the other upper insulating resin sheets 10 makes it possible to reduce the stress which generates in the vicinity of the interface between the prepreg 4 and the surficial layer.

Although the above-described embodiment dealt with the prepreg 4 of 1.0 mm thick, composed of the stack of 50 carbon fiber sheets 1 and two carbon fiber sheets 2 holding it in between, it is also allowable to stack a plurality of thin prepregs. An exemplary case is such that a stack of 10 carbon fiber sheets 1 is held between two stacks of the carbon fiber sheets 2 to thereby form a prepreg of 0.2 mm thick. Five units of thus-configured prepregs are then stacked and pressed in a vacuum, to thereby form a prepreg of 1.0 mm thick. It is to be noted that, even in the case of using such prepreg, the thermal expansion coefficient of the first carbon fiber group disposed at the center portion is set larger than those of the second carbon fiber groups disposed on the surficial layer sides.

The patent document 1 describes a core layer which adopts a stacked structure of carbon fiber layers and insulating resin layers. There is, however, no description in relation to the thermal expansion coefficient.

The patent document 2 describes adjustment of the thermal expansion coefficient of a printed wiring board on which electronic components are mounted. There is, however, no description in relation to the multilevel interconnection board.

The patent document 3 describes a board for semiconductor mounting having an intermediate layer provided between a metal layer and a ceramic layer, wherein the ratio of content of metal of the intermediate layer is gradated. There is, however, no description in relation to the multilevel interconnection board, and in relation to the thermal expansion coefficient.

Because difference in the thermal expansion coefficients among portions of the board can be moderated, the present invention makes it possible to suppress generation of internal stress with increase in the temperature, while suppressing the thermal expansion coefficient to a low level. This consequently improves the reliability and yield ratio of the board.

What is claimed is:

1. A multilevel interconnection board comprising:
   a base; and
   a plurality of interconnection layers formed on said base;
   said base comprising:
   a first fiber group; and
   a second fiber group disposed closer to said interconnection layers than said first fiber group,
   and having a thermal expansion coefficient larger than that of said first fiber group wherein said base is electrically insulated from said plurality of interconnection layers;
   wherein said first and said second fiber groups are composed of a carbon fiber group wherein a carbon purity of said second fiber group is lower than a carbon purity of said first fiber group.

2. The multilevel interconnection board according to claim 1, wherein said interconnection layers are disposed on both sides of said base, and
   wherein said base further comprises another second fiber group which has a thermal expansion coefficient larger than that of said first fiber group, and is placed so that said first fiber group is disposed between said two second fiber groups.

3. The multilevel interconnection board according to claim 1, wherein said base contains a resin component impregnated into said first and second fiber groups.

4. The multilevel interconnection board according to claim 1, wherein a thermal expansion coefficient of fibers composing said second fiber group is larger than a thermal expansion coefficient of fibers composing said first fiber group.

5. The multilevel interconnection board according to claim 1, wherein a fiber density per unit volume of said second fiber group is smaller than a fiber density of said first fiber group.

6. The multilevel interconnection board according to claim 1, wherein said first and said second fiber groups are composed of any one selected from the group consisting of pitch-base carbon fiber, PAN-base carbon fiber, short carbon fiber, and non-woven-fabric-base fiber.

7. The multilevel interconnection board according to claim 1, wherein said interconnection layers are buried in an insulating layer, and a thermal expansion coefficient at the portion in contact with said base is lower than a thermal expansion coefficient at any portions separated from said base in said insulating layer.

* * * * *

UNITED STATES PATENT AND TRADEMARK OFFICE
CERTIFICATE OF CORRECTION

| | | |
|---|---|---|
| PATENT NO. | : 7,622,184 B2 | Page 1 of 1 |
| APPLICATION NO. | : 11/339511 | |
| DATED | : November 24, 2009 | |
| INVENTOR(S) | : Okamoto et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 607 days.

Signed and Sealed this
Third Day of May, 2011

David J. Kappos
*Director of the United States Patent and Trademark Office*